(12) United States Patent
Nyqvist

(10) Patent No.: US 6,637,109 B2
(45) Date of Patent: Oct. 28, 2003

(54) METHOD FOR MANUFACTURING A HEAT SINK

(75) Inventor: Mathias Nyqvist, Bromma (SE)

(73) Assignee: Emerson Energy Systems AB, Stockholm (SE)

( * ) Notice: Subject to any disclaimer, the term of this patent is extended or adjusted under 35 U.S.C. 154(b) by 0 days.

(21) Appl. No.: 09/965,639

(22) Filed: Sep. 27, 2001

(65) Prior Publication Data

US 2003/0056368 A1 Mar. 27, 2003

(51) Int. Cl.[7] ............................................. B23P 15/26
(52) U.S. Cl. ............................. 29/890.03; 29/890.054; 228/183
(58) Field of Search ................... 29/890.03, 890.054; 228/183; 165/80.3

(56) References Cited

U.S. PATENT DOCUMENTS

| | | | | |
|---|---|---|---|---|
| 4,669,535 A | * | 6/1987 | Seidler | 165/78 |
| 5,558,155 A | * | 9/1996 | Ito | 165/80.3 |
| 6,279,648 B1 | * | 8/2001 | Diels et al. | 165/80.3 |
| 2001/0001416 A1 | * | 5/2001 | Lee et al. | 165/80.3 |
| 2001/0001898 A1 | * | 5/2001 | Lee et al. | 29/890.03 |

* cited by examiner

Primary Examiner—I Cuda-Rosenbaum
(74) Attorney, Agent, or Firm—Harness, Dickey & Pierce, P.L.C.

(57) ABSTRACT

The present invention relates a method of manufacturing a high fin density heat sink comprising the steps of: aligning a plurality of length sections side by side in a mutual parallel arrangement, said length sections having a cross-section comprising a first end portion, a second end portion and a web portion connecting said first and second end portions, said first and second end portions having a width wider then the width of the web portion; clamping the parallelly arranged length sections together, such that said first and second end portions of adjacent parallel length sections are abutting against each other; and bonding the length sections together by applying at least one friction stir welding (FSW) seam across the end portions of the parallelly arranged length sections.

6 Claims, 2 Drawing Sheets

METHOD FOR MANUFACTURING A HEAT SINK

TECHNICAL FIELD OF THE INVENTION

The present invention relates to the manufacture of heat sinks, and in particular the manufacture of high fin density heat sinks.

BACKGROUND OF THE INVENTION

Electronic components such as those being attached to e.g. printed circuit boards dissipate heat during operation and thus need to be cooled, so as to prevent damages caused by rapidly increasing component temperatures.

To this end, heat sinks are frequently employed for enlarging the heat-emitting surface of such components. However, equipment comprising such electronic components has, due to technological advances, become more and more compact, which also effects the size of the heat sinks in a corresponding way. Still, the heat dissipation of the components has not decreased to the same extent. Thus, great demands are put on heat sink efficiency, and therefore the ratio between heat sink cooling capacity and heat sink dimensions needs to be maximised.

One common type of a heat sink 51 is shown in FIG. 2, which to the right is partly cut away. The heat sink comprises a top base plate 53, a bottom base plate 55 and a plurality of webs 57 or fins connecting the top and bottom base plates. The material is commonly aluminium alloys. The top base plate 53 and the bottom base plate 55, each have an upper surface 59 and a lower surface 61 serving as mounting surfaces for electronic, heat generating components 63 (components are for the sake of clarity only shown on the upper surface 59). These components 63 may be adhered or by other suitable means bonded to the surfaces. During operation of the electronic components 63 heat is generated by the components, which heat is transferred to the heat sink 51 and further being distributed to the fins 57. Gaps 65 between the fins are serving as passageways for a not shown forced convection air flow, which is cooling the fins 57 of the heat sink, by transporting heated air to the surroundings. An effective heat sink requires that the fin spacing should be as low as possible (i.e. high fin density), which imply a large heat-emitting surface.

The research and development for such high fin density heat sinks are continuously under progress, and several methods of manufacture are well known in the art. However, many of these related art methods suffer from various disadvantages resulting in heat sinks not complying with stipulated cooling requirements.

One way of manufacturing the above mentioned type of heat sinks is by extruding a complete heat sink in one single operation. However, extrusion and die cast tooling limitations restrain required fin height to air gap thickness ratios, whereby desired shapes, i.e. extremely high fin density structures, are impossible to accomplish.

To overcome this drawback an other method may imply the assembly of two base plates 73, 75 with a plurality of parallel fins 77, as schematically shown in FIG. 3. In this case each base plate is extruded in a separate operation. The base plates 73, 75 are provided with recesses 79 intended for corresponding fins 77 during assembly of a complete heat sink profile 71. It is obvious for the man skilled in the art that desired fin height to air gap thickness ratios more easily can be achieved by this method in comparison with the complete extrusion method described above, but the assembly is very time-consuming. Moreover, the fins 77 need to be bonded in some way to the recesses of the base plates 73, 75.

Yet an other method would be to extrude length sections 91 comprising upper and lower base plate portions 93, 95 connected by a web 97 as schematically shown in FIG. 4. Each length section 91 is provided with upper and lower slots 99, 101 as well as upper and lower protrusions 103, 105, which protrusions are intended to fit into the slots of an adjacent length section 91 during assembly of the various length sections. These length sections are then bonded to each other creating a complete heat sink. Although this method is less time consuming in a assembling point of view, compared to the latter method, and that high fin height to air gap thickness ratios easily may be achieved, the various length sections still need to be bonded together in some way.

As mentioned above all these methods would require bonding in some way. Below follows a variety of bonding methods and reasons why they are not suitable for these applications.

If an adhesive is used as a bonding material, in the junctions between the parts to be assembled, a deteriorated heat conductivity could be the consequence, since the coefficient of thermal transmission of adhesives generally is very poor. Certainly, the coefficient of thermal transmission may be sufficient if special adhesives containing, e.g. powdered silver are used, but such adhesives are very expensive.

Soldering and conventional welding would as a bonding method imply extensive heating of the various parts. High temperatures are required and the whole structure is normally intensively heated, whereby deformation of the material is likely to occur leading to rejections of material. Furthermore, additives such as solder metal is added to the joints between the parts to be bonded, which may deteriorate the overall heat conducting properties of the heat sink. Moreover, extensive cleaning is required of the parts to be assembled prior to the soldering and welding operations.

The parts to be assembled could also be press fitted as disclosed in U.S. Pat. No. 6,138,352. However, the tolerances when manufacturing these parts need to be rigorous, which make the method more expensive. Furthermore, oxidation in the junctions between the parts to be assembled are also probable, which will deteriorate the overall thermal conductivity of the heat sink. Moreover, the method also give rise to small air cavities in the junctions between fins and base plates, due to tolerance limitations of the various parts. These air cavities reduce the heat conductivity to the fins but also in the lateral directions of the base plates. Furthermore, screw holes disposed in the top or bottom base plates may jeopardise the press joints when the screws are tightened.

OBJECT OF THE INVENTION

An object of the present invention is to provide a simple and reliable, and thus cost effective, method for manufacturing a high performance heat sink having a high fin density.

Yet an object of the present invention is to provide a method for manufacturing a high performance heat sink without the disadvantages associated with related art methods.

SUMMARY OF THE INVENTION

These objects are achieved according to the present invention by means of a method having the features mentioned in the independent claims.

In a first embodiment of the present invention the method comprises the steps of: aligning a plurality of length sections side by side in a mutual parallel arrangement, said length sections having a cross-section comprising a first end portion, a second end portion and a web portion connecting said first and second end portions, said first and second end portions having a width wider then the width of the web portion; clamping the parallelly arranged length sections together, such that said first and second end portions of adjacent parallel length sections are abutting against each other; and bonding the length sections together by applying at least one friction stir welding (FSW) seam across the end portions of the parallelly arranged length sections.

In a second embodiment of the present invention the method comprises the steps of: extruding an elongated profile bar having a cross-section comprising a first end portion, a second end portion and a web portion connecting said first and second end portions, said first and second end portions having a width wider then the width of the web portion; cutting up said elongated profile bar into a plurality of length sections; aligning said plurality of length sections side by side in a mutual parallel arrangement; clamping the parallelly arranged length sections together, such that said first and second end portions of adjacent parallel length sections are abutting against each other; and bonding the length sections together by applying at least one friction stir welding (FSW) seam across the end portions of the parallelly arranged length sections.

In a third embodiment of the present invention the method comprises the steps of: bending a plurality of length sections having a cross-section comprising a first end portion, a second end portion and a web portion connecting said first and second end portions, said first and second end portions having a width wider then the width of the web portion; aligning said plurality of length sections side by side in a mutual parallel arrangement; clamping the parallelly arranged length sections together, such that said first and second end portions of adjacent parallel length sections are abutting against each other; and bonding the length sections together by applying at least one friction stir welding (FSW) seam across the end portions of the parallelly arranged length sections.

Friction stir welding, FSW is a relatively new method being developed during the 90's by The Welding Institute (TWI) in Cambridge. It has shown good results particularly for aluminium, including die-cast aluminium. FSW is a process where a rotating cylindrical tool comprising a shoulder and pin are forced into, e.g. a joint of two parts to be welded together. These parts need to be rotary fixed in a chuck appliance or a similar device. During the welding operation the rotating tool is pressed down into the material and is moved along the joint under maintained pressure of the tool. The material becomes locally heated due to the friction between tool and material. As a consequence of this friction heat the material is plasticized. The movement of the tool create a ridge of plasticized metal bonding the two parts together. At the same time oxides at the surfaces are vaporising. The metal is forced around and behind the tool creating a pore and crack proof weld. The metal is never melting during the process, but is only plasticized at approximately 500° C. (when aluminium is used as material) in the contact surface between tool and material. The area which becomes heated is narrow, and generally, the temperature in the seam only reaches 200–300° C. for a few seconds.

By applying such a FSW-seam across the parallelly arranged length sections a simple and fast way of bonding the various length sections is achieved.

In comparison with conventional soldering and welding operations FSW is a low temperature operation. Thus, thermal stresses such as tensions and weaknesses in the material are minimised, whereby material deformation is unlikely to occur.

Furthermore, since no soldering or welding material is added during the FSW-operation heat conductivity properties are maintained in all directions of the complete heat sink.

Moreover, the length sections to be welded together may also have rough tolerances in comparison with the pressing method earlier described. This simplifies the manufacture of the length sections, as well as their assembly.

Since the method comprises the assembly of a plurality of length sections, a high fin density heat sink is easily achieved compared to the case where the whole heat sink was extruded.

Moreover, the welding seam can be deeply made without any extra ordinary preparations of the length sections before the welding operation.

Additionally, the related art problem with cavities and oxidation in the junctions between the parts to be assembled is also solved, since oxides and other impurities are dissolved during the friction stir welding operation.

Advantageously, the aligning step comprises aligning a predetermined amount of length sections. Hereby is achieved a flexible method of manufacturing high performance heat sinks in dependence of cooling requirements, and of adapting the shape of the complete heat sink to specific market demands.

Preferably, the extruding step comprises the extrusion of substantially I-, U-, and S-shaped elements. Hereby, simple shapes can easily be manufactured through, e.g. extrusion and/or bending operations, which facilitate the assembly and bonding of a high fin density heat sink. However, the I-shape is most preferable due to its symmetrical shape, which is advantageous when the length sections are collected in a magazine after the cutting up step.

Advantageously, when only one friction stir welding (FSW) seam is applied across the end portions of the parallelly arranged length sections, a lot of space is available for screw holes, e.g. intended for suspension of the heat sink or for attachment of components. Thus, the screw holes would not interfere with the FSW-seam.

Suitably, all the steps are effected in an automatic way under supervision of a computer controlled facility. Hereby is achieved a fully automatic system, with no or little human intervention, which speeds up the manufacturing process.

DRAWING SUMMARY

A preferred embodiment of the present invention will now be described with reference to the accompanying drawings, on which:

FIG. 1b is a schematic top view of the manufacture of a high fin density heat sink in FIG. 1a.

DETAILED DESCRIPTION OF PREFERRED EMBODIMENTS

Figure 1A:
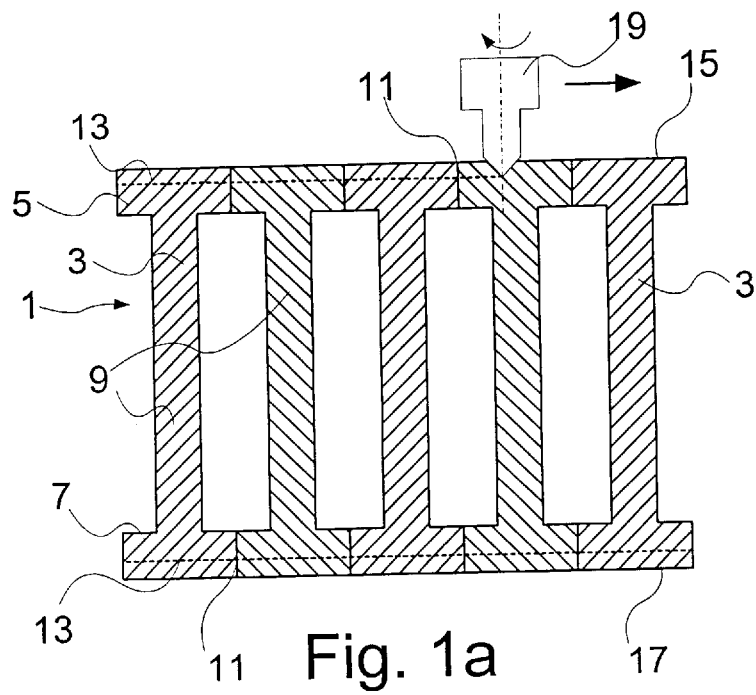
FIG. 1a is a schematic side view of a method of manufacture of a high fin density heat sink in accordance with the present invention.
Figure 1B:
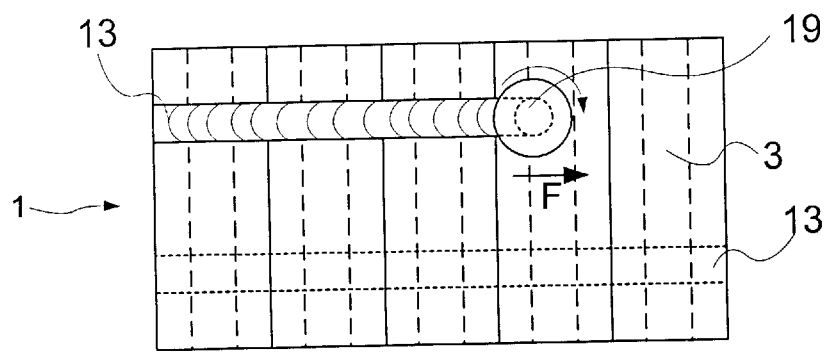
Figure 2:
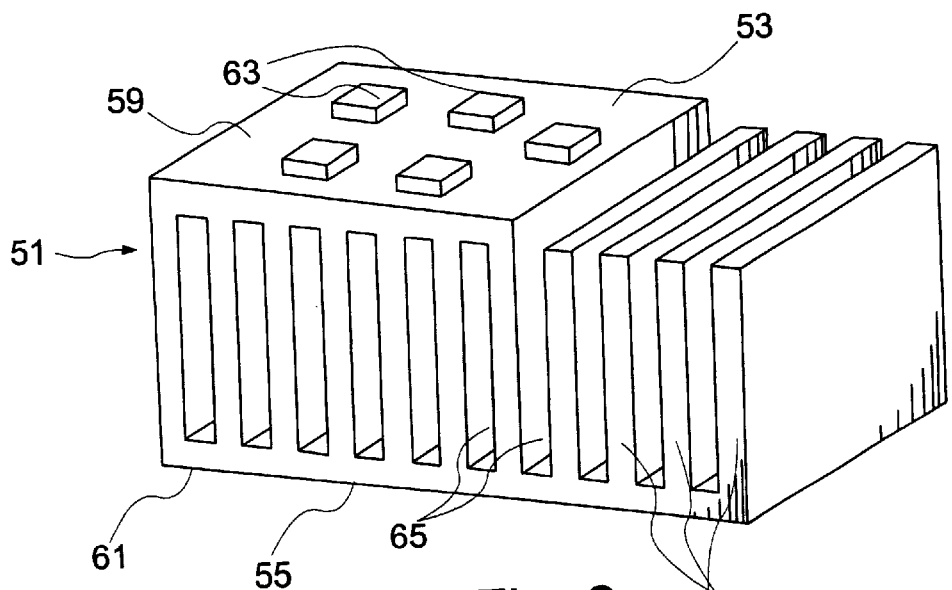
FIG. 2 is a partly cut-away perspective view of a high fin density heat sink in accordance with related art.
Figure 3:
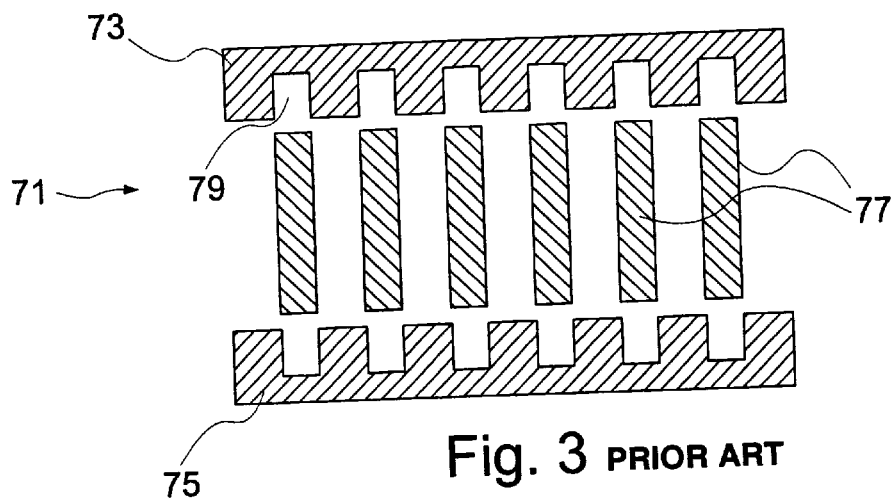
FIG. 3 is a schematic side view of a method of assembling a high fin density heat sink according to related art.
Figure 4:
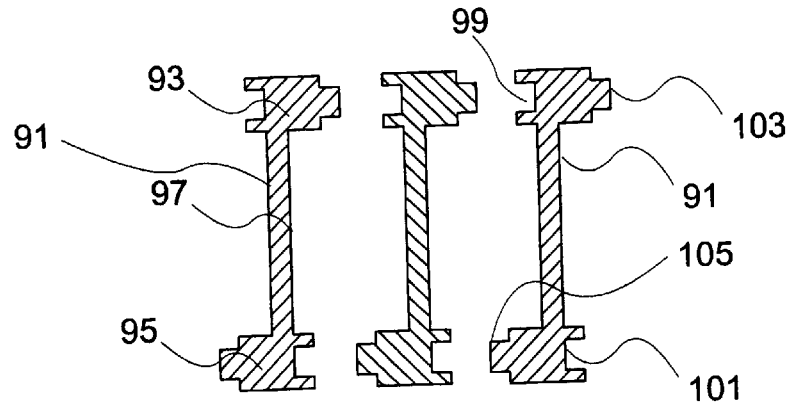
FIG. 4 is a schematic side view of a yet a method of assembling a high fin density heat sink according to related art.

FIGS. 1a–b show a side and a top view, respectively of a heat sink 1 of the same type as is shown in FIG. 2 during manufacture in accordance with the present invention. As is evident from the figure the heat sink 1 is assembled from five length sections 3 each having a substantially I-shaped cross-section comprising a first end portion 5, a second end portion 7 and a web portion 9 connecting the first and second end portions. These length sections 3 have earlier preferably been cut up from a not shown elongated profile bar having the same cross-section as the five length sections, which profile bar preferably is formed in an extrusion process. As is also evident from the figures, the first 5 and second 7 end portions each have a width being wider than the width of the web portion 9. Therefor, when the five length sections are put together side by side and parallelly aligned with each other, as depicted in FIG. 1a, contact surfaces 11 of the first and second end portions of adjacent length sections will abut against each other.

Figure 1C:
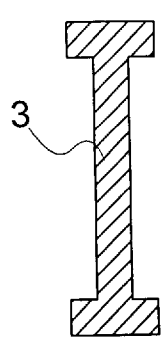
FIG. 1c is an I-shaped cross-sectional view of a heat sink length section.
Figure 1D:
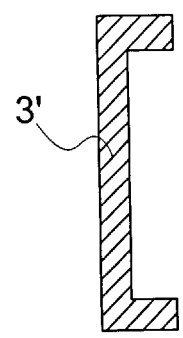
FIG. 1d is an U-shaped cross-sectional view of a heat sink length section.
Figure 1E:
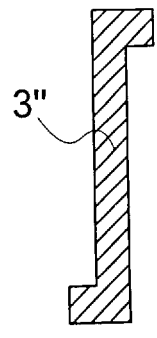
FIG. 1e is a S-shaped cross-sectional view of a heat sink length section

In this arrangement the parallelly arranged length sections are clamped by means of a not shown clamping facility, so as to press the contact surfaces 11 against each other. The various length sections 3 are now bonded to each other by means of friction stir welding (FSW), which principles are well known in the art and described in a previous part of the application, i.e. "SUMMARY OF THE INVENTION". As can be seen from both FIG. 1a and FIG. 1b FSW-seams 13 are shown, one on a top surface 15 and one on a bottom surface 17 of the clamped length sections. A FSW-pin 19 is moving across the five length sections 3 (indicated by the arrow F) applying a pressure to the surface of the clamped length sections at the same as it rotates. Frictional heat is generated between the FSW-pin 19 and the material of the length sections, which due to the heat is locally softened and plasticized. Thus, in joints between adjacent length sections plasticized material are mixed and will subsequently solidify when the FSW-pin 19 has passed by. Hereby, a FSW-seam is formed, which depth may be determined in dependence of strength requirements. FIGS. 1c–e show different preferred cross-sections of the length sections 3, 3', 3" described with reference to the previous figures. FIG. 1c shows a substantially I-shaped cross-section as described with reference to FIGS. 1a–b, FIG. 1d a substantially U-shaped cross-section, while FIG. 1e shows a substantially S-shaped length section. All these length sections 3, 3', 3" may be formed in a extrusion operation forming elongated profile bars, which then are cut up in proper lengths depending on appliance. The U- and S-shaped length sections 5', 5" may also be formed in a bending operation.

The invention is of course not limited to the assemble of the above mentioned length sections, but the length sections may also take other forms being simple to manufacture and assemble to high fin density heat sinks.

What is claimed is:

1. Method of manufacturing a high fin density heat sink comprising the steps of:

aligning a plurality of length sections side by side in a mutual parallel arrangement, said length sections having a cross-section comprising a first end portion, a second end portion and a web portion connecting said first and second end portions, said first and second end portions having a width wider than the width of the web portion;

clamping the parallely arranged length sections together, such that said first and second end portions of adjacent parallel length sections are abutting against each other; and bonding the length sections together by applying at least one friction stir welding (FSW) seam across the end portions of the parallelly arranged length sections.

2. Method according to claim 1, wherein the aligning step comprises aligning a predetermined amount of length sections.

3. Method according to claim 1, wherein all the steps are effected in an automatic way under supervision of a computer controlled facility.

4. Method according to claim 1, said cross-section being substantially I-shaped.

5. Method according to claim 1, said cross-section being substantially U-shaped.

6. Method according to claim 1, said cross-section being substantially S-shaped.

* * * * *